United States Patent [19]
Fujikura

[11] Patent Number: 5,949,271
[45] Date of Patent: Sep. 7, 1999

[54] BOOTSTRAP CIRCUIT SUITABLE FOR BUFFER CIRCUIT OR SHIFT REGISTER CIRCUIT

[75] Inventor: Katsuyuki Fujikura, Tokyo, Japan

[73] Assignee: NEC Corporation, Tokyo, Japan

[21] Appl. No.: 08/946,358

[22] Filed: Oct. 7, 1997

[30] Foreign Application Priority Data

Oct. 7, 1996 [JP] Japan .................................. 8-266128

[51] Int. Cl.$^6$ .................................................. H03K 17/16
[52] U.S. Cl. ............................ 327/390; 327/589; 326/88
[58] Field of Search .................................. 327/390, 536, 327/589; 326/88

[56] References Cited

U.S. PATENT DOCUMENTS

| | | | |
|---|---|---|---|
| 4,443,720 | 4/1984 | Takamae | 307/578 |
| 4,689,505 | 8/1987 | Ghoshal | 307/482 |
| 5,680,071 | 10/1997 | Senoh et al. | 327/390 |
| 5,818,258 | 10/1998 | Choi | 326/83 |
| 5,828,262 | 10/1998 | Rees | 327/390 |

FOREIGN PATENT DOCUMENTS 61-7724  1/1986  Japan .
1-52934  11/1989  Japan .

*Primary Examiner*—Kenneth B. Wells
*Assistant Examiner*—Hai L. Nguyen
*Attorney, Agent, or Firm*—Sughrue, Mion, Zinn, Macpeak & Seas, PLLC

[57] ABSTRACT

A potential across an output terminal (OUT) is applied to a node N2 through a transistor (Tr66) even when a potential across a node N1 is higher than a power source voltage Vdd due to a bootstrap effect. Accordingly, the potentials between the drain and the source electrodes are not higher than the power source voltage Vdd for both a transistor (Tr62) and the transistor (Tr66). This allows circuit designing without setting the withstand voltage for the transistor over the power source voltage Vdd.

14 Claims, 11 Drawing Sheets

5,949,271

1

BOOTSTRAP CIRCUIT SUITABLE FOR BUFFER CIRCUIT OR SHIFT REGISTER CIRCUIT

BACKGROUND OF THE INVENTION

The present invention relates to a bootstrap circuit used for a shift register circuit or a buffer circuit. More specifically, the present invention relates to a bootstrap circuit in which a voltage that is equal to or lower than a power source voltage for the circuit is applied between a source and a drain of all transistors forming the circuit.

Shift register circuits and buffer circuits are widely used for generating a scan signal and/or driving a matrix array in matrix-type display devices, image sensors, or semiconductor memory devices.

A push-pull output circuit is typically used for an output stage of a shift register circuit or a buffer circuit of the type described. For example, an example is given with an output circuit employing an N-channel transistor. A voltage Vgs between a gate and a source gradually decreases as an output voltage is raised in a transistor on the higher potential side among the transistors forming the push-pull output circuit. The transistor is turned off when the voltage Vgs becomes smaller than Vt, that is, Vgs<Vt where Vt is a threshold voltage of the transistor. Therefore, (Vgs−Vt) is the lower limitation appeared on the amplitude waveform of the output voltage across the output circuit. Such output circuit has a limitation of fast operation.

Taking this into consideration, output circuits using a bootstrap effect have been proposed. The output circuit of this type can provide the output voltage that is equal to the power source voltage Vdd and is applicable to fast operation. Therefore, this output circuit is widely used for circuits that require performance at a high speed.

As apparent from the description below, the conventional output circuits using the bootstrap effect have the problem that it is necessary:

(a) to design the circuit to restrict the bootstrap effect;

(b) to lower the power source voltage for the circuit; and (c) to provide a circuit configuration requiring no reset transistor.

SUMMARY OF THE INVENTION

Accordingly, an object of the present invention is to provide a bootstrap circuit which is capable of performing fast operation without any means for satisfying the above mentioned requirements.

A bootstrap circuit according to the present invention comprises a signal input terminal, a first terminal which is supplied with a power source voltage Vdd on a higher potential side, a second terminal which is supplied with a power source voltage Vss on a lower potential side, and a reset transistor connected between a point where the potential exceeds the power source voltage Vdd and the signal input terminal or the second terminal, the reset transistor having a gate electrode to which a control signal is applied.

According to a first aspect of the present invention, a voltage that is equal to or lower than the power source voltage Vdd is applied between a drain electrode and a source electrode of all transistors forming the bootstrap circuit.

Alternatively, a bootstrap circuit according to the present invention comprises a signal input terminal, a first terminal which is supplied with a power source voltage Vdd on a higher potential side, a second terminal which is supplied with a power source voltage Vss on a lower potential side, a third terminal which is supplied with clock pulses, and an output terminal.

According to a second aspect of the present invention, one main electrode of a first transistor is connected to the first terminal or the third terminal. Another main electrode of the first transistor is connected to one main electrode of a second transistor, which is connected to an output terminal. Another main electrode of the second transistor is connected to the second terminal. The gate electrode of the first transistor is connected to one main electrode of a third transistor. Another main electrode of the third transistor is connected to one main electrode of a fourth transistor. Another main electrode of the fourth transistor is connected to the second terminal or the signal input terminal. A junction between the third and the fourth transistors is connected to the output terminal or the third terminal.

DESCRIPTION OF THE PREFERRED EMBODIMENTS

Figure 1:
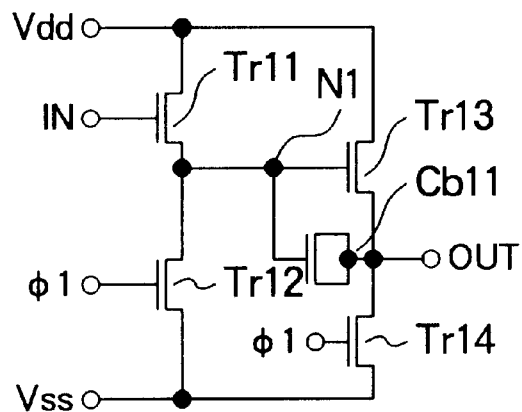
FIG. 1 is a circuit diagram showing a fundamental structure of a conventional bootstrap type buffer circuit.

Referring to FIG. 1, a fundamental structure of a conventional bootstrap type buffer circuit is described for the purpose of facilitating the understanding of the present invention. A transistor used for the buffer circuit may be, for example, an N-channel transistor. A transistor Tr13 and a transistor Tr14 form an output circuit of a push-pull type. A common junction for the transistors Tr13 and Tr14 serves as an output terminal OUT. On the other hand, a common junction (hereinafter, referred to as a node) N1 for the source electrode of a transistor Tr11 and the drain electrode of a transistor Tr12 is connected to the gate electrode of the transistor Tr13. A bootstrap capacitor Cb11 is connected between the node N1 and the output terminal OUT. The boot-strap capacitor Cb11 is not necessarily provided. Instead, a gate-source capacitor of the transistor Tr13 may be used. The bootstrap capacitor Cb may typically be achieved by a MOS capacitor but it is the one achieved only by an insulating layer.

Figure 2:
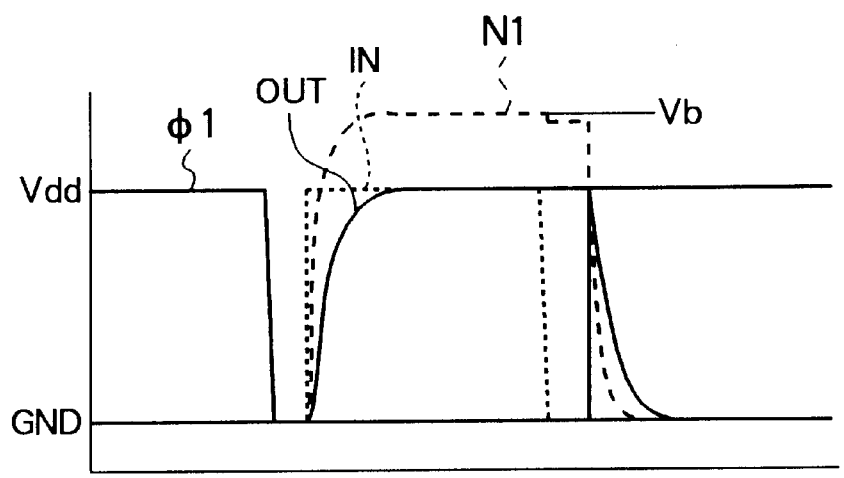
FIG. 2 is a view illustrating signal waveforms taken across certain points in the circuit in FIG. 1 for use in describing operation of that circuit.

Next, operation of the buffer circuit is described with reference to the timing chart in FIG. 2. In FIG. 2, a clock pulse is represented by $\Phi 1$ and the amplitude of the voltage between a high level and a low level of an input signal IN is represented by (Vdd–Vss). The transistor Tr11 is turned on when the clock pulse $\Phi 1$ is the low level and the input signal IN becomes the high level to charge the node N1 by the terminal of the power source voltage Vdd. The transistor Tr11 is turned off when the potential across the node N1 rises and the potential across the gate and source of the transistor Tr11 becomes lower than a threshold voltage Vt for the transistor Tr11. As a result, the potential across the node N1 is kept at (Vdd–Vt). On the other hand, the transistor Tr13 is turned on as the potential across the node N1 rises and a load (not shown) connected to the output terminal OUT is charged.

The load is typically a capacitive load formed of, for example, the gate of the transistor and wiring. In this event, the load is charged with a voltage (Vdd–2Vt). The potential across the node N1 increases over the level of the holding voltage (Vdd–Vt) through the bootstrap capacitor Cb11 described above when the potential across the output terminal OUT increases. Accordingly, the transistor Tr13 is kept closed, i.e., conducted and the potential across the output terminal OUT further rises. The potential across the node N1 also rises through the bootstrap capacitor Cb11. Finally, the potential across the node N1 exceeds the power source voltage Vdd. Therefore, the transistor Tr13 is kept closed after the potential across the output terminal OUT rises to the level of the power source voltage Vdd. The output terminal OUT drops to the low level when the input signal IN reaches to the low level and the clock pulse $\Phi 1$ reaches to the high level. In response to this, the node N1 is discharged through the reset transistor Tr12 to the power source voltage Vss at a low potential. The above-mentioned operation allows the bootstrap circuit to operate at a high speed with a large output. In FIG. 2, Vb represents the potential across the node N1.

As apparent from the above, the buffer circuit in FIG. 1 requires the reset transistor Tr12.

Figure 3:
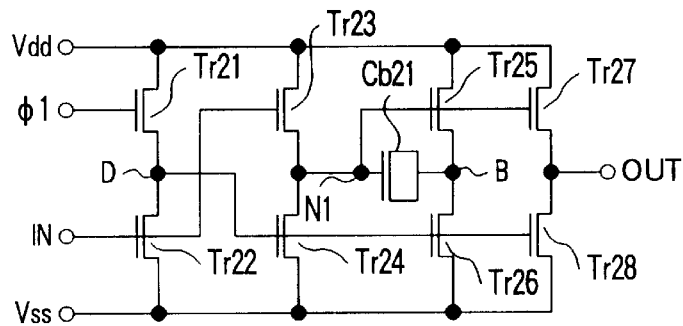
FIG. 3 is a circuit diagram showing an example of a conventional bootstrap type buffer circuit.

Referring to FIG. 3, another example of a conventional bootstrap type buffer circuit is described. A transistor Tr21 generates a signal to reset the node N1 and the output terminal OUT to the potential Vss at the timing of the clock pulse $\Phi 1$. Transistors Tr23 through Tr26 and the bootstrap capacitor Cb21 operates like the transistors Tr11 through Tr14 and the bootstrap capacitor Cb11, respectively, in the fundamental circuit shown in FIG. 1. The potential across the node N1 rises to (Vdd–Vt) because of charging by the input signal IN. The potential across the node N1 exceeds the power source voltage Vdd by the bootstrap effect through the bootstrap capacitor Cb21. Therefore, the transistor Tr27 is kept closed and the potential at the high level across the output terminal OUT can be the same level as the power source voltage Vdd.

Figure 4:
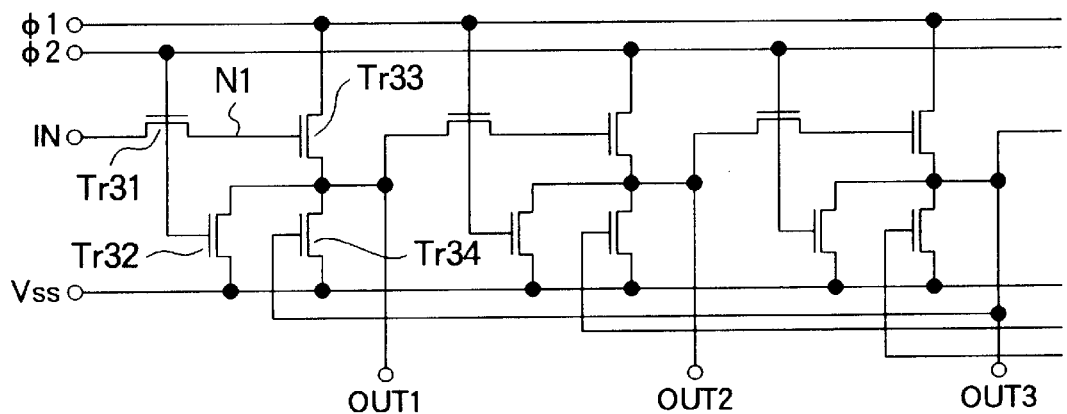
FIG. 4 is a circuit diagram showing an example of a conventional bootstrap type shift register circuit.

Referring to FIG. 4, a conventional bootstrap type shift register circuit is described. This shift register circuit is disclosed in Japanese Patent Publication No. Tokkai Heil-52934(52934/1989). The shift register circuit is formed of stages of shift registers and each stage comprises at least three transistors Tr31 through Tr33. A transistor Tr34 is provided to ensure reset of the output terminal OUT. For the shift register at the first stage, the transistors Tr32 and Tr33 form a push-pull output circuit and a common junction for the transistors Tr33 and Tr34 serves as an output terminal OUT1. The shift registers at the second and third stages have similar structure and have output terminals OUT2 and OUT3, respectively.

One of two-phase clock pulses $\Phi 1$ and $\Phi 2$ (clock pulse $\Phi 1$ in this example) is supplied to the drain electrode of the transistor Tr33. The gate electrode of the transistor Tr33 is connected to one of the source electrode and the drain electrode of the transistor Tr31. This junction is referred to as a node N1. The other clock pulse (clock pulse $\Phi 2$ in this example) is supplied to the gate electrodes of the transistors Tr31 and Tr32. It is noted that a capacitor that serves as a bootstrap capacitor should be connected between the gate and drain electrodes or between the gate and source electrodes, or both between the gate and drain electrodes or between the gate and source electrodes of the transistor Tr33. In this event, the capacitor may be a MOS capacitor or a capacitor achieved only by an insulating layer, as described above.

Figure 5:
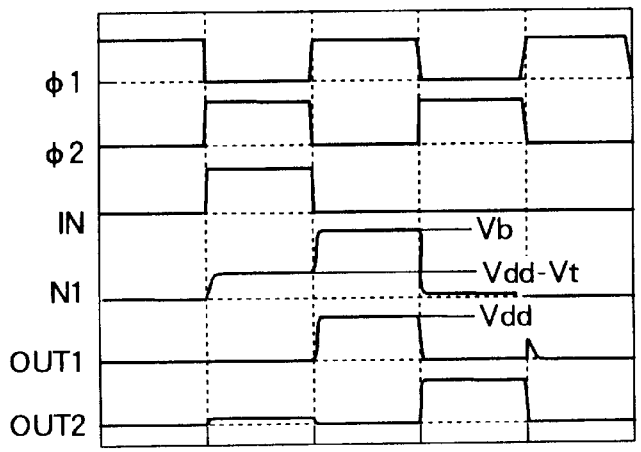
FIG. 5 is a view illustrating signal waveforms taken across certain points in the circuit in FIG. 4 for use in describing operation of that circuit.

Operation of the shift register circuit in FIG. 4 is described with reference to the timing chart in FIG. 5. In FIG. 5, the clock pulses are represented by Φ1 and Φ2 and the amplitude of the voltage between the high level and the low level of an input signal IN is represented by (Vdd–Vss). The transistor Tr33 is turned on when the clock pulse Φ2 is the high level while the input signal IN is the high level to pre-charge the node N1 to the potential level of (Vdd–Vt). At that time, the output terminal OUT is the low level because the clock pulse Φ1 is the low level.

The transistor Tr31 is turned off when the clock pulse Φ2 becomes the low level, so that the charge on the node N1 is maintained. The potential across the output terminal OUT1 rises in response to the high level of the clock pulse Φ1. The potential across the node N1 rises above the power source voltage Vdd because of the bootstrap effect through the gate capacitor of the transistor Tr33. Therefore, the high potential across the output terminal OUT1 can be the same level as the power source voltage Vdd.

When the clock pulse Φ2 becomes the high level at the subsequent timing the transistor Tr32 is closed and the output terminal OUT1 is reset to the low level. At the same time, the node N1 is discharged towards the input side through the transistor Tr31. The node N1 is thus reset to the low level.

Figure 6:
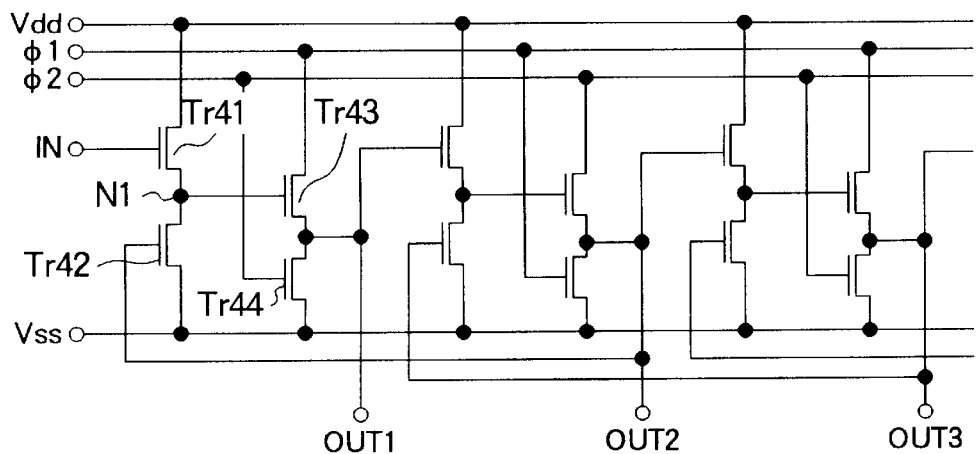
FIG. 6 is a circuit diagram showing an example of a conventional bootstrap type shift register circuit.

Referring to FIG. 6, another example of a conventional bootstrap type shift register circuit is described. This shift register circuit is formed of stages of shift registers and each stage comprises at least three transistors Tr31 through Tr33. A transistor Tr34 is provided to ensure reset of the output terminal OUT. For the shift register at the first stage, the transistors Tr32 and Tr33 form a push-pull output circuit and a common junction for the transistors Tr33 and Tr34 serves as an output terminal OUT1. The shift registers at the second and third stages have similar structure and have output terminals OUT2 and OUT3, respectively.

One of two-phase clock pulses Φ1 and Φ2 (clock pulse Φ1 in this example) is supplied to the drain electrode of the transistor Tr43. The gate electrode of the transistor Tr43 is connected to the source electrode of the transistor Tr41 and the drain electrode of the transistor Tr42. This junction is referred to as a node N1. The other clock pulse (clock pulse Φ2 in this example) is supplied to the gate electrode of the transistor Tr44. The power source voltage Vdd or the input signal IN is supplied to the drain electrode of the transistor Tr41. It is noted that a capacitor that serves as a bootstrap capacitor should be connected between the gate and drain electrodes or between the gate and source electrodes, or both between the gate and drain electrodes or between the gate and source electrodes of the transistor Tr43. In this event, the capacitor may be a MOS capacitor or a capacitor achieved only by an insulating layer.

Figure 7:
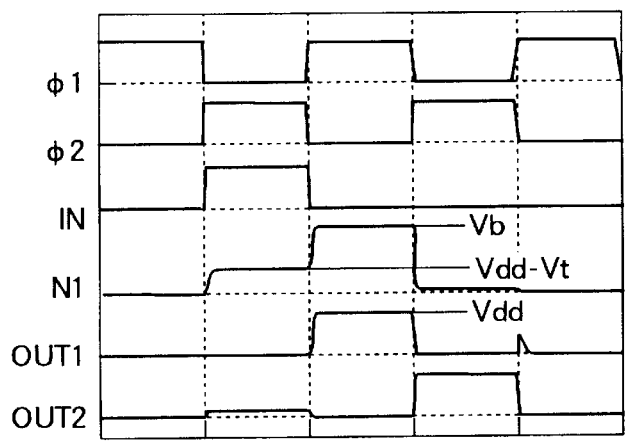
FIG. 7 is a view illustrating signal waveforms taken across certain points in the circuit in FIG. 6 for use in describing operation of that circuit.

Operation of the shift register circuit in FIG. 6 is described with reference to the timing chart in FIG. 7. In FIG. 5, the clock pulses are represented by Φ1 and Φ2 and the amplitude of the voltage between the high level and the low level of the input signal IN is represented by (Vdd–Vss). As a result, the node N1 is charged and the transistor Tr43 is conducted. At that time, the output terminal OUT is the low level because the clock pulse Φ1 is the low level. The potential across the output terminal OUT rises in response to the high level of the clock pulse Φ1. The potential across the node N1 rises above the power source voltage Vdd because of the bootstrap effect through the gate capacitor of the transistor Tr43. Therefore, the high potential across the output terminal OUT1 can be the same level as the power source voltage Vdd.

When the clock pulse Φ2 becomes the high level at the subsequent timing the transistor Tr44 is closed and the output terminal OUT1 is reset to the low level. At the same time, the output terminal OUT2 becomes the high level, causing the transistor Tr42 to be conducted. Therefore, the node N1 is reset to LOW.

Figure 8:
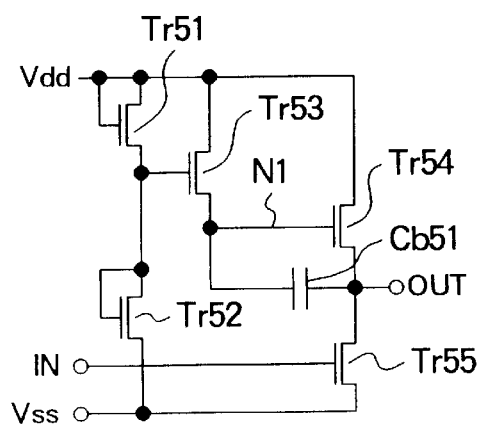
FIG. 8 is a circuit diagram showing an example of a conventional bootstrap type inverter circuit.

Referring to FIG. 8, a conventional bootstrap type inverter circuit is described. This inverter circuit is disclosed in Japanese Patent Laid-open No. Tokkai sho 61-7724 (7724/1986). The high level of the input signal IN causes a transistor Tr55 to be conducted and the output terminal OUT becomes the low level. The low level of the input signal IN causes a transistor Tr54 (conducted) to rise the potential across the output terminal OUT. The potential across the node N1 rises above the power source voltage Vdd because of the bootstrap effect through the gate capacitor of the transistor Tr53.

Although some examples of the prior art are described above, the conventional bootstrap circuit has the following drawbacks. The potential across the node N1 rises above the power source voltage Vdd in the buffer circuit in FIG. 3 and the shift register circuit in FIGS. 4 and 6. Therefore, it is necessary to use the transistor for resetting the potential across the node N1. More specifically, the voltage higher than the power source voltage Vdd is applied between the drain and the source electrodes of the transistor Tr24 in the buffer circuit in FIG. 3. The voltage higher than the power source voltage Vdd is applied between the drain and the source electrodes of the transistor Tr31 in the shift register circuit in FIG. 4. Likewise, the voltage higher than the power source voltage Vdd is applied between the drain and the source electrodes of the transistor Tr42 in the shift register circuit in FIG. 6. When the potential across the node N1 exceeds the withstand voltage of the transistors (Tr24, Tr31, Tr42), the transistors may be broken down.

On the other hand, the inverter circuit in FIG. 8 has no such a reset transistor. The difference in potential is equal to or smaller than the power source voltage Vdd between the drain and the source electrodes of all transistors. However, a constant current flows through the circuit when the input signal IN is the high level because the transistor Tr54 in this inverter circuit is kept closed. This increases consumption current for the circuit. In addition, the low output voltage across the output terminal OUT is divided for the transistors Tr54 and Tr55 rather than being identical to the power source voltage on the lower potential side. As a result, the output voltage has a smaller amplitude. Operational margin in the subsequent stage(s) is thus decreased.

In order to overcome the problem of transistor breakdown, the circuit may be designed such that the ratio of the gate capacitor of the output transistor on the higher potential side is smaller than the whole capacitor of the node N1 to restrict the bootstrap effect. More specifically, the push-pull output transistor may be reduced in size. Alternatively, the bootstrap capacitor may be reduced. However, this approach increases an ON resistance at the output transistor on the higher potential side, decreasing the operation speed. In addition, reduction of the power source voltage Vdd also increases the ON resistance at the output transistor to decrease the operation speed.

Figure 9:
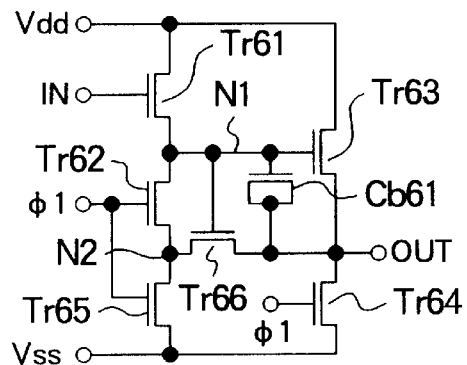
FIG. 9 is a circuit diagram showing a fundamental structure of a buffer circuit using a bootstrap circuit according to the present invention.

Referring to FIG. 9, a fundamental structure of a buffer circuit using a bootstrap circuit according to the present invention is described. In this buffer circuit, an N-channel MOS field effect transistor (MOS FET) is used. However, it is understood that a P-channel MOS FET may equally be used. Transistors Tr63 and Tr64 form a push-pull output circuit. A common junction for the transistors Tr63 and Tr64 serves as an output terminal OUT. A common junction N1 for the source electrode of a transistor Tr61 and the drain electrode of a transistor Tr62 is connected to the gate electrode of the transistor Tr63. On the other hand, the drain electrode of the transistor Tr63 is connected to a terminal for the power source voltage Vdd on the higher potential side or a terminal for a clock signal having a different phase from the clock pulse Φ1. This embodiment illustrates an example where the drain electrode of the transistor Tr63 is connected to the terminal for the power source voltage Vdd. The drain and the source electrodes of the transistor Tr62 and a transistor Tr65, respectively, are connected between the node N1 and the terminal for the power source voltage Vss on the lower potential side. A node N2 between the transistors Tr62 and Tr65 is connected to the output terminal OUT through the source and the drain electrodes of a transistor Tr66. The clock pulse Φ1 is supplied to both gate electrodes of the transistors Tr62 and Tr65. The clock pulse Φ1 may be called a control signal. A bootstrap capacitor Cb61 is connected between the node N1 and the output terminal OUT. The bootstrap capacitor Cb61 is not necessarily used. The gate-source capacitor of the transistor Tr63 may be used in place of the bootstrap capacitor Cb61. The bootstrap capacitor Cb61 may typically be achieved by a MOS capacitor but it is the one achieved only by an insulating layer.

Figure 10:
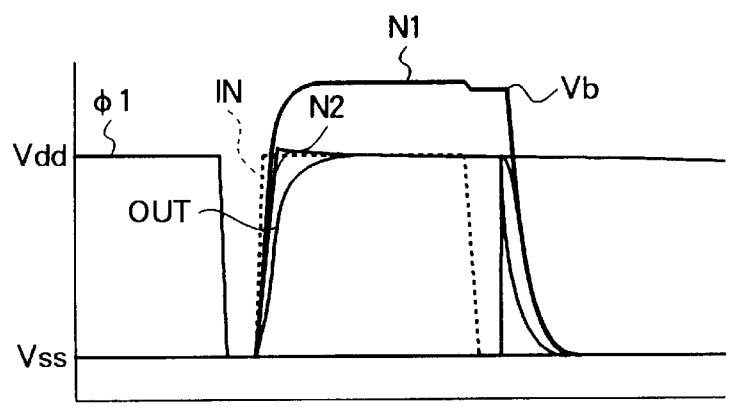
FIG. 10 is a view illustrating signal waveforms taken across certain points in the circuit in FIG. 9 for use in describing operation of that circuit.

Next, operation of the fundamental circuit in FIG. 9 is described with reference to the timing chart in FIG. 10. In this event, a clock pulse is represented by Φ1 and the amplitude of the voltage between the high level and the low level of the input signal IN is represented by (Vdd−Vss), which are not limited thereto.

First, the transistor Tr61 is turned on when the clock pulse Φ1 is the low level and the input signal IN becomes the high level to charge the node N1 by the power source voltage Vdd. The transistor Tr61 is turned off when the potential across the node N1 rises and the potential across the gate and the source of the transistor Tr11 becomes lower than a threshold voltage Vt for the transistor Tr61. As a result, the potential across the node N1 is kept at (Vdd−Vt). On the other hand, the transistor Tr63 is turned on as the potential across the node N1 rises and a load (not shown) connected to the output terminal OUT is charged. The load may typically be a capacitive load formed, for example, the gate of a transistor and wiring. In this event, the load is charged with a voltage (Vdd−2Vt).

The potential across the node N1 increases over the level of the holding voltage (Vdd−Vt) through the bootstrap capacitor Cb61 described above when the potential across the output terminal OUT increases. Accordingly, the transistor Tr63 is kept closed, i.e., conducted and the potential across the output terminal OUT further rises. The potential across the node N1 also rises through the bootstrap capacitor Cb61. The potential Vb across the node N1 at that time is given by:

$$Vb = Vdd - Vt + Cgs/(Cgs + Ct) * Vout \qquad (1),$$

where Cgs is a sum of the gate-source capacitor of the transistor Tr63 and the bootstrap capacitor Cb61, Ct is capacitors other than Cgs in the node N1, and Vout is an increase of the potential across the output terminal OUT.

As apparent from the above equation, the maximum value for the potential Vb is smaller than (2Vdd−Vt). The potential Vb across the node N1 is thus higher than the power source voltage Vdd. Therefore, the potential across the output terminal OUT rises to the level of the power source voltage Vdd and the transistor Tr63 is kept closed.

The transistor Tr61 is turned off when the input signal IN is the low level to stop charging to the node N1. Subsequently, the high level of the clock pulse Φ1 causes the transistors Tr62, Tr64, and Tr65 to be conducted. In response to this, the potential across the output terminal OUT is reset to the potential Vss and the nodes N1 and N2 are also reset to the potential Vss.

In this event, a time interval during which the potential across the node N1 is higher than the power source voltage Vdd should be noted. During this interval, the transistor Tr66 is already conducted so that the potential across the output terminal OUT is applied to the node N2 through the transistor Tr66. Therefore, the voltage between the drain and the source of the transistor Tr65 becomes equal to the power source voltage Vdd, which is the high potential across the output terminal OUT. The voltage between the drain and the source of the transistor Tr62 becomes (Vb−Vdd). The maximum value for the potential Vb is (2Vdd−Vt) from the equation (1), so that the maximum value for the voltage between the drain and the source of the transistors Tr65 is equal to (Vdd−Vt). Taking a transient state in FIG. 10 into consideration, a change in potential across the node N1 over (Vdd−Vt) exhibits the bootstrap effect as the output potential Vout increases from the potential Vss as expressed by the equation (1). This indicates that the maximum value for the voltage between the drain and the source of the transistor Tr62 is also not higher than (Vdd−Vt) in the transient state.

The above description concludes that the voltage between the drain and the source is not higher than the power source voltage Vdd for all transistors in this embodiment.

The clock pulse supplied to the gate electrode of the transistor Tr64 may be generated at a different timing from the clock pulse Φ1. However, it is preferable that the clock pulse in question shift from the high level to the low level after the timing when the clock pulse Φ1 shifts from the high level to the low level or when the input signal IN changes from the low level to the high level.

The bootstrap circuit of this embodiment is typically formed of transistors obtained by means of doping impurities into a semiconductor substrate and thermal diffusion. However, the bootstrap circuit may be formed by using thin film transistors (TFT). More specifically, a semiconductor layer is deposited on an insulating substrate, which is activated by means of laser, heat, or light. An insulating layer is deposited on the semiconductor layer and a gate electrode is then formed. The gate electrode is used as a mask to dope impurities into the activated semiconductor region. The thin film transistor is thus obtained. However, the bootstrap circuit may be formed according to a different process and the above-mentioned example is not a limitation.

Next, some embodiments of the present invention are described.

(Embodiment 1)

Figure 11:
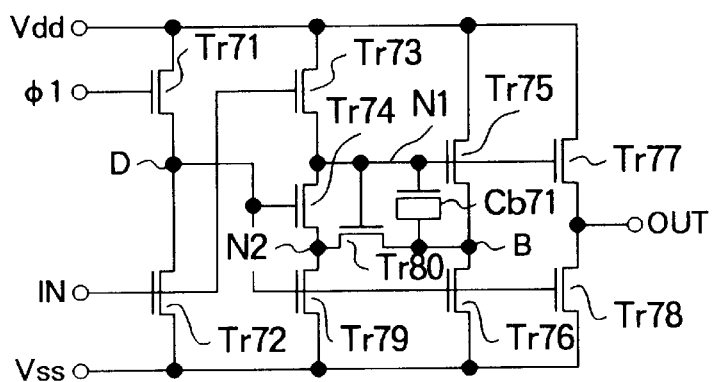
FIG. 11 is a circuit diagram showing a first embodiment of a buffer circuit using a bootstrap circuit according to the present invention.
Figure 12:
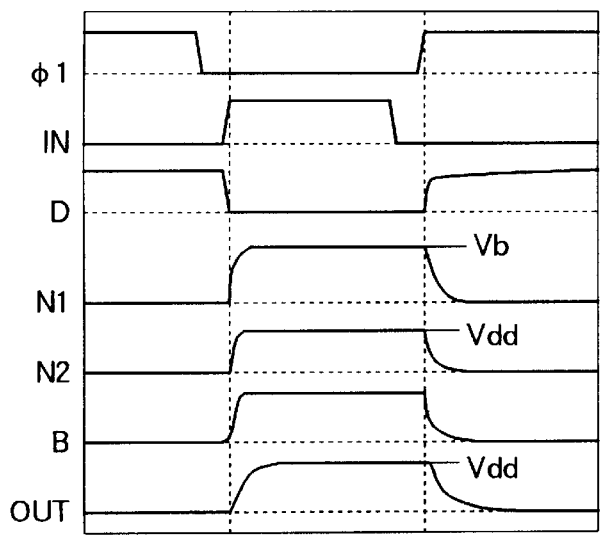
FIG. 12 is a view illustrating signal waveforms taken across certain points in the circuit in FIG. 11 for use in describing operation of that circuit.

A first embodiment of a buffer circuit having a bootstrap circuit according to the present invention is described with reference to FIGS. 11 and 12. In FIG. 11, transistors Tr73 through Tr76, Tr79, and Tr80, and a bootstrap capacitor Cb71 are similar to those described in conjunction with the fundamental circuit in FIG. 9.

The node N1 is charged through the transistor Tr73 when the clock pulse Φ1 shifts from the high level to the low level and the input signal IN shifts from the low level to the high level. At that time, a node D is the low level and thus the reset for the nodes N1, N2, B, and the output terminal OUT is released. An increase of the potential across the node N1 causes the transistors Tr75 and Tr77 to be conducted, resulting in rising of the potentials across the node B and the output terminal OUT. As a result, the potential across the node N1 becomes higher than the power source voltage Vdd because of the bootstrap effect caused through the bootstrap capacitor Cb71. At that time, the potential across the node B is equal to the power source voltage Vdd. By applying this potential to the node N2 through a transistor Tr80, the voltage between the drain and the source electrodes becomes equal to or lower than the power source voltage Vdd for all transistors. When the input signal is the low level, the charging to the node N1 is stopped. When the clock pulse Φ1 shifts to the high level, the nodes N1 and B as well as the output terminal OUT are reset to the low level.

(Embodiment 2)

Figure 13:
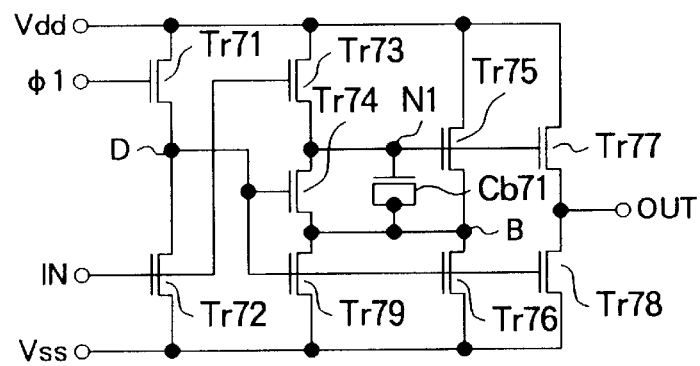
FIG. 13 is a circuit diagram showing a second embodiment of a buffer circuit using a bootstrap circuit according to the present invention.

The second embodiment of a buffer circuit having a bootstrap circuit according to the present invention is described with reference to FIG. 13. This embodiment is similar to the first embodiment in FIG. 11 except that the transistor Tr80 in FIG. 1 is omitted and that the node B is connected to the junction between the transistors Tr74 and Tr79. Operation of the buffer circuit according to the second embodiment is similar to those described with reference to the timing chart in FIG. 12. Therefore, no repetitive description will be made. In this second embodiment, the voltage between the drain and the source electrodes is equal to or lower than the power source voltage Vdd for all transistors.

(Embodiment 3)

Figure 14:
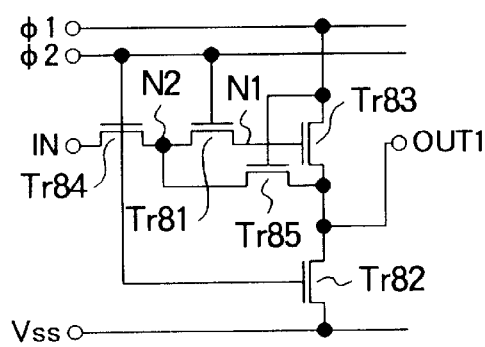
FIG. 14 is a circuit diagram showing a fundamental structure of a shift register circuit using a bootstrap circuit according to the present invention.
Figure 15:
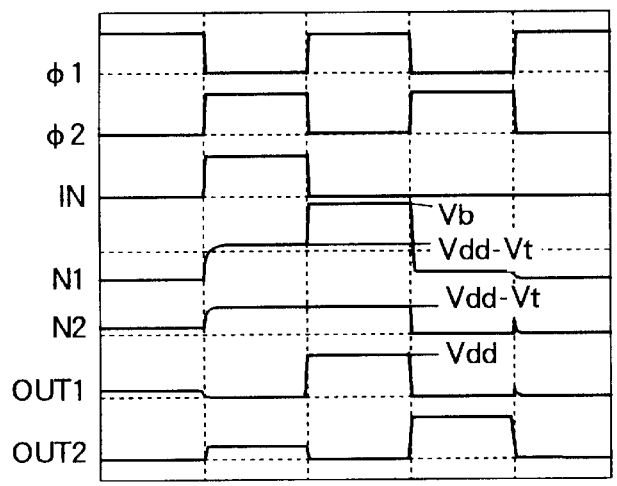
FIG. 15 is a view illustrating signal waveforms taken across certain points in the circuit in FIG. 14 for use in describing operation of that circuit.

Referring to FIGS. 14 and 15, a fundamental structure of a shift register circuit using a bootstrap circuit according to the present invention is described. In this shift register circuit, a transistor used is an N-channel MOS field effect transistor (MOS FET). However, it is understood that a P-channel MOS FET may equally be used. Transistors Tr83 and Tr82 form a push-pull output circuit. A common junction for the transistors Tr83 and Tr82 serves as an output terminal OUT1. The drain and the source electrodes of a transistor Tr81 and a transistor Tr84, respectively, are connected in series between the gate electrode of the transistor Tr83 and the input signal IN. A node N2 between the transistors Tr81 and Tr84 is connected to the output terminal OUT1 through the source and the drain electrodes of a transistor Tr85. However, the clock pulse Φ1 may be supplied or the power source voltage Vdd may be applied to the node N2 rather than connecting the node to the output terminal OUT1. The clock pulse Φ1 is supplied to the gate electrode of the transistor Tr85.

One of two-phase clock pulses Φ1 and Φ2 (clock pulse Φ1 in this example) is supplied to the drain electrode of the transistor Tr83. The gate electrode of the transistor Tr83 is connected to one of the source and the drain electrodes of the transistor Tr81. This junction is referred to as a node N1. The other clock pulse (clock pulse Φ2 in this example) is supplied to the gate electrodes of the transistors Tr81 and Tr82. The clock pulse Φ2 may be also called a control signal. While not illustrated in FIG. 14, a capacitor that serves as a bootstrap capacitor may be connected between the gate and the drain electrodes or between the gate and the source electrodes, or both between the gate and the drain electrodes or between the gate and the source electrodes of the transistor Tr83. In this event, the capacitor may be a MOS capacitor or a capacitor achieved only by an insulating layer.

Next, operation of the fundamental circuit in FIG. 14 is described with reference to the timing chart in FIG. 15 for the shift register in the first stage. In FIG. 15, a clock pulse is represented by Φ1 and the amplitude of the voltage between the high level and the low level of the input signal IN is represented by (Vdd–Vss).

The transistors Tr81 and Tr84 are turned on when the lock pulse Φ2 is the high level while the input signal IN is the high level to pre-charge the nodes N1 and N2 to the potential level of (Vdd–Vt). At that time, the transistor Tr83 is conducted but the output terminal OUT1 is the low level because the clock pulse Φ1 is the low level. The charge on the node N1 is held at the timing when the clock pulse Φ2 shifts to the low level. On the other hand, the output terminal OUT1 becomes the high level because the clock pulse Φ1 is the high level and the charge is supplied through the transistor Tr83 by the clock pulse Φ1. Capacitors are present between the gate and the drain electrodes of the transistor Tr83 and between the gate and the source electrodes thereof. The potential across the node N1 rises above the holding voltage (Vdd–Vt) because of the bootstrap effect through the individual capacitors. Accordingly, the transistor Tr83 is kept conducted. The potential Vb across the node N1 at that time is given by:

$$Vb = Vdd - Vt + Cg/(Cg+Ct)*Vout \qquad (2),$$

where Cg is a sum of the gate electrode capacitor of the transistor Tr83 and the bootstrap capacitor which is not shown, Ct is capacitors other than Cg in the node N1, and Vout is an increase of the potential across the output terminal OUT1.

As apparent from the above equation (2), the maximum value for the potential Vb across the node N1 is smaller than (2Vdd–Vt). The output terminal OUT1 is reset to the low level by the transistor Tr82 when the clock pulse Φ2 shifts to the high level at the subsequent timing. As a result, the charge on the nodes N1 and N2 is reset to the input side in the low level.

In this event, a time interval during which the potential across the node N1 is higher than the power source voltage Vdd should be noted. During this interval, the transistor Tr85 is already conducted so that the potential across the output terminal OUT1 is applied to the node N2 through the transistor Tr85. The potential across the node N2 at that time is (Vdd–Vt). Therefore, the voltage between the drain and the source of the transistor Tr84 is (Vdd–Vt). The voltage between the drain and the source of the transistor Tr81 is {Vb–(Vdd–Vt)}. Since the maximum value for the potential Vb is (2Vdd–Vt) from the equation (2), then the maximum value for the voltage between the drain and the source of the transistor Tr81 becomes equal to the power source voltage Vdd. Taking a transient state in FIG. 14 into consideration, a change in potential across the node N1 over (Vdd–Vt) exhibits the bootstrap effect as the output potential Vout and the potential of the clock pulse Φ1 increase from the potential Vss. This indicates that the maximum value for the voltage between the drain and the source of the transistor Tr81 is also not higher than the power source voltage Vdd in the transient state. This indicates that the voltage between the drain and the source electrodes becomes equal to or lower than the power source voltage Vdd for all transistors.

(Embodiment 4)

Figure 16:
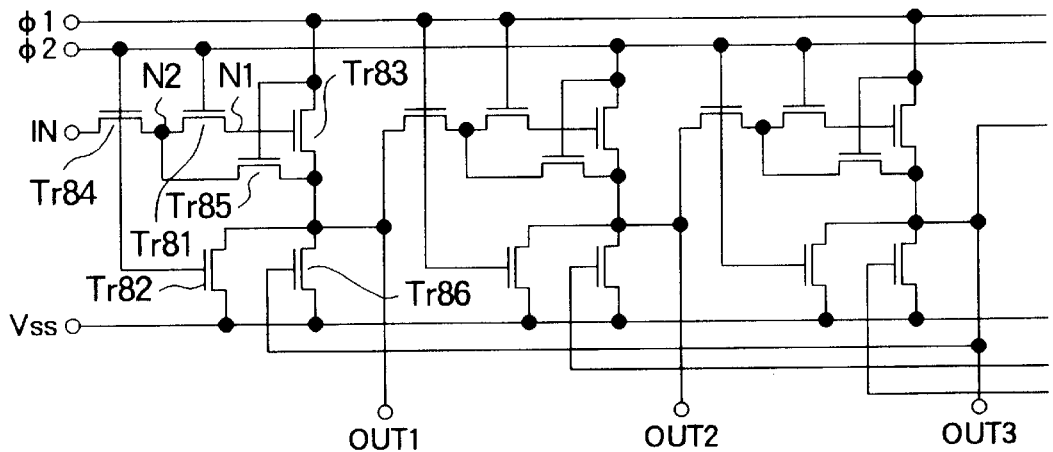
FIG. 16 is a circuit diagram showing a first embodiment of a shift register circuit using a bootstrap circuit according to the present invention.

The first embodiment of a shift register circuit having a bootstrap circuit according to the present invention is described with reference to FIG. 16 in addition to FIG. 15. This shift register circuit is formed of the shift registers shown in FIG. 14 that are connected into a plurality of stages. The shift register in each stage is similar in structure to the shift register illustrated in FIG. 14 except that a transistor Tr86 is included. The transistor Tr86 is connected between the output terminal OUT1 and the power source voltage Vss. The gate electrode of the transistor Tr86 is connected to an output terminal OUT3 in the stage after the next stage.

The transistors Tr84 and Tr81 are turned on when the clock pulse Φ2 is the high level while the input signal IN is the high level to pre-charge the nodes N1 and N2 to the potential level of (Vdd - Vt). At that time, the transistor Tr83 is conducted but the output terminal OUT1 is the low level because the clock pulse Φ1 is the low level. The charge on the node N1 is held at the timing when the clock pulse Φ2 shifts to the low level. On the other hand, the output terminal OUT1 becomes the high level because the clock pulse Φ1 is the high level and the charge is supplied through the transistor Tr83 by the clock pulse Φ1. The potential across the node N1 rises above the holding voltage (Vdd−Vt) because of the bootstrap effect through the individual capacitors between the gate and the drain electrodes of the transistor Tr83 and between the gate and the source electrodes thereof. Accordingly, the transistor Tr83 is kept conducted. When the clock pulse Φ2 becomes the high level at the subsequent timing, the transistor Tr82 is closed and the output terminal OUT1 is reset to the low level. At the same time, the nodes N1 and N2 are discharged towards the input side in the low level.

The transistor Tr86 is for use in preventing the low potential across the output terminal OUT1 from being fluctuated due to re-distribution of the charge, which otherwise would occur when the nodes N1 and N2 in the second stage are reset.

(Embodiment 5)

Figure 17:
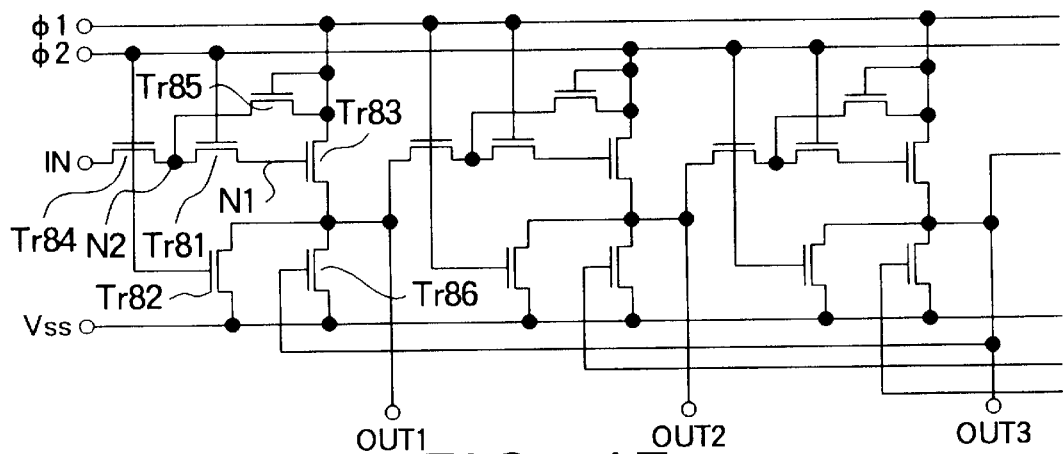
FIG. 17 is a circuit diagram showing a second embodiment of a shift register circuit using a bootstrap circuit according to the present invention.

The second embodiment of a shift register circuit having a bootstrap circuit according to the present invention is described with reference to FIG. 17. The difference between the shift register circuit in the second embodiment and the shift register circuit shown in FIG. 16 is that the drain and the source electrodes of the transistor Tr85 are connected to between a supply line for the clock pulse Φ1 or Φ2 and the node N2. Operation of the circuit is similar to those described in conjunction with FIG. 15 and detailed description thereof is thus omitted.

(Embodiment 6)

Figure 18:
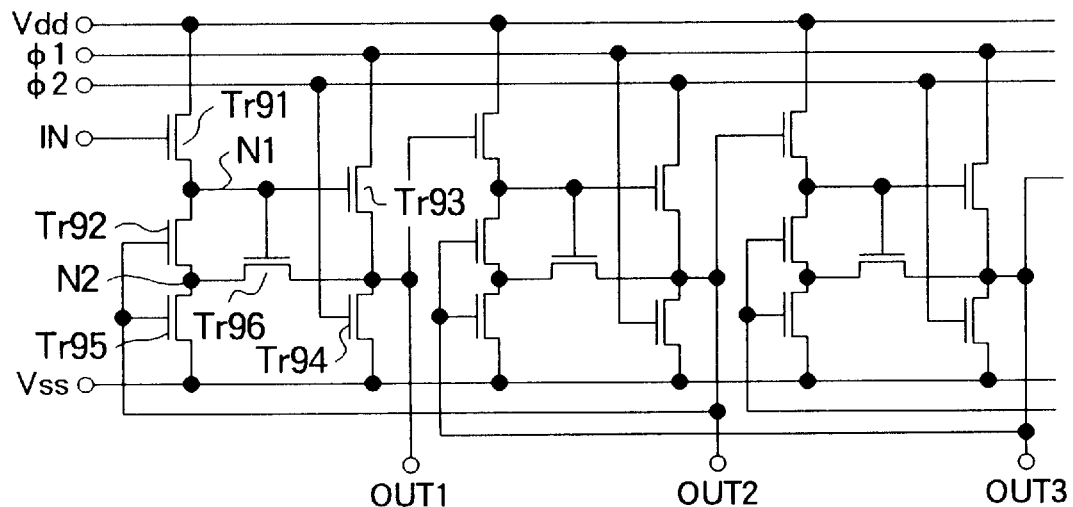
FIG. 18 is a circuit diagram showing a third embodiment of a shift register circuit using a bootstrap circuit according to the present invention.
Figure 19:
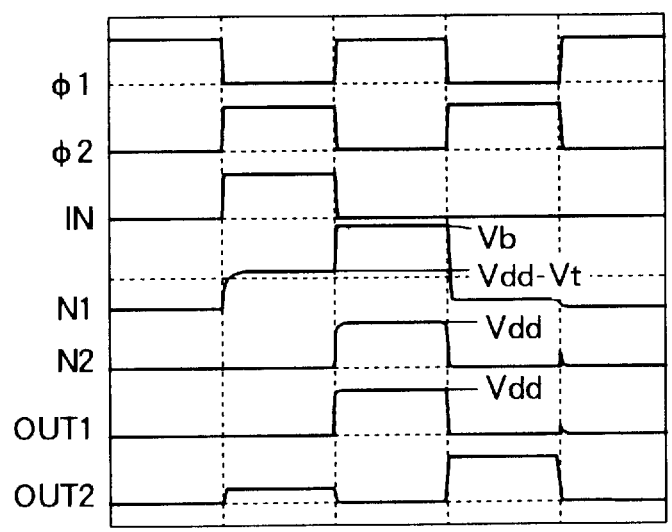
FIG. 19 is a view illustrating signal waveforms taken across certain points in the circuit in FIG. 18 for use in describing operation of that circuit.

The third embodiment of a shift register circuit having a bootstrap circuit according to the present invention is described with reference to FIGS. 18 and 19. The difference from the fundamental circuit shown in FIG. 14 is that the charge of the nodes N1 and N2 is reset to the power source voltage Vss on the lower potential side rather than on the input side. More specifically, the drain and the source electrodes of transistors Tr92 and Tr95 are connected in series between the node N1 and a terminal for the power source voltage Vss. The gate electrode of a transistor Tr91 is supplied with the input signal IN and the power source voltage Vdd on the higher potential side is applied to the drain electrode of the transistor Tr91. The input signal IN may be supplied to the gate and the drain electrodes of the transistor Tr91. In this shift register circuit, an N-channel MOS field effect transistor (MOSFET) is used for the transistors. However, it is understood that a P-channel MOSFET may equally be used.

Operation is described for the shift register in the first stage. The transistor Tr91 is turned on when the input signal IN is the high level to pre-charge the node N1 to the potential level of (Vdd−Vt). At that time, the transistor Tr93 is conducted but the output terminal OUT1 is the low level because the clock pulse Φ1 is the low level. The charge on the node N1 is held at the timing when the input signal IN becomes the low level. On the other hand, the output terminal OUT1 becomes the high level because the clock pulse Φ1 is the high level and the charge is supplied through the transistor Tr93 by the clock pulse Φ1. The potential across the node N1 rises above the holding voltage (Vdd−Vt) because of the bootstrap effect through the individual capacitors between the gate and the drain electrodes of the transistor Tr93 and between the gate and the source electrodes thereof. Accordingly, the transistor Tr93 is kept conducted. When the clock pulse Φ2 becomes the high level at the subsequent timing, the transistor Tr94 reset the output terminal OUT1 to the low level. At the same time, the transistors Tr92 and Tr95 are conducted because an output terminal OUT2 in the subsequent stage is turned to the high level. As a result, the charge on the nodes N1 and N2 is reset to the power source voltage Vss on the lower potential side.

(Embodiment 7)

Figure 20:
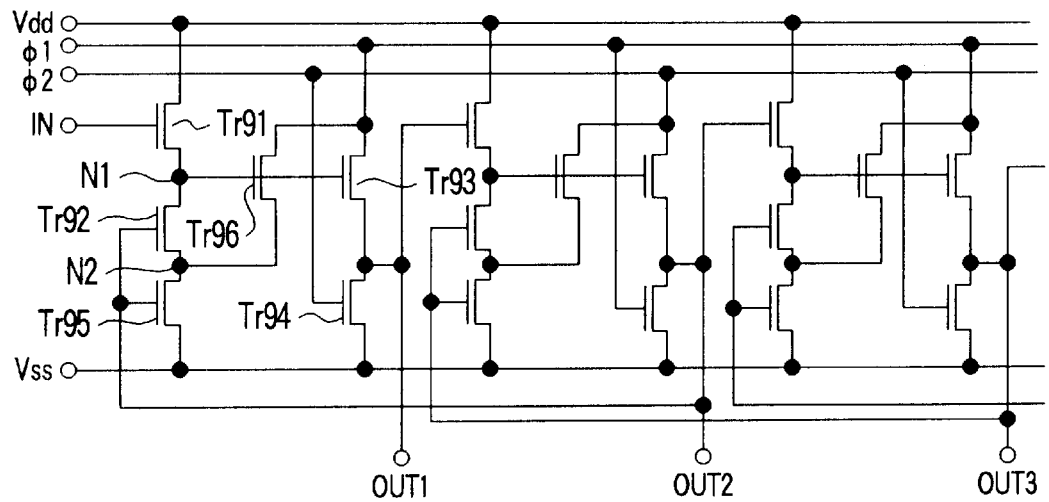
FIG. 20 is a circuit diagram showing a fourth embodiment of a shift register circuit using a bootstrap circuit according to the present invention.

The fourth embodiment of a shift register circuit having a bootstrap circuit according to the present invention is described with reference to FIG. 20. The difference between this shift register circuit and the shift register shown in FIG. 18 is that the drain and the source electrodes of the transistor Tr96 are connected alternatively stage by stage between a supply line for the clock pulse Φ1 and the node N2 or between a supply line for the clock pulse Φ2 and the node N2. Operation of the circuit is similar to those described in conjunction with FIG. 18 and detailed description thereof is thus omitted.

(Embodiment 8)

Figure 21:
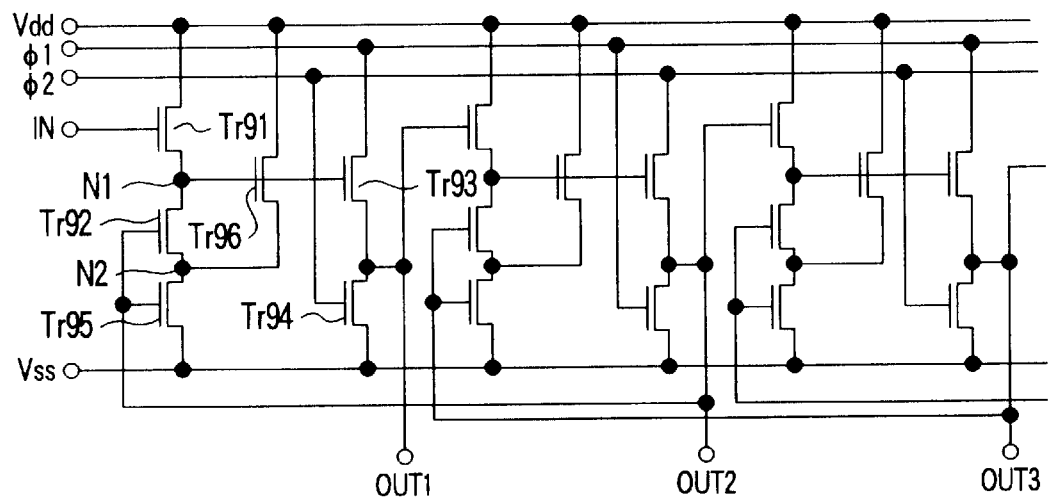
FIG. 21 is a circuit diagram showing a fifth embodiment of a shift register circuit using a bootstrap circuit according to the present invention.

The fifth embodiment of a shift register circuit having a bootstrap circuit according to the present invention is described with reference to FIG. 21. The difference between the shift register circuit and the shift register shown in FIG. 18 is that the drain and the source electrodes of the transistor Tr96 are connected between the power source voltage Vdd on the higher potential side and the node N2. Operation of the circuit is similar to those described in conjunction with FIG. 18 and detailed description thereof is thus omitted.

(Embodiment 9)

Figure 22:
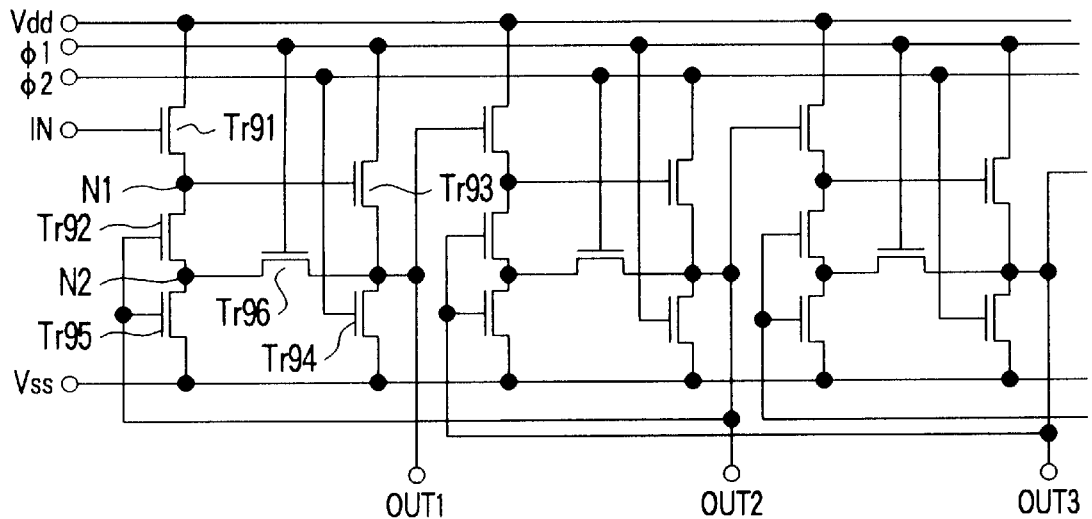
FIG. 22 is a circuit diagram showing a sixth embodiment of a shift register circuit using a bootstrap circuit according to the present invention.

The sixth embodiment of a shift register circuit having a bootstrap circuit according to the present invention is described with reference to FIG. 22. The difference between the shift register circuit and the shift register shown in FIG. 18 is that the gate electrode of the transistor Tr96 is connected alternatively stage by stage to a terminal for the clock pulse Φ1 or a terminal for the clock pulse Φ2. Operation of the circuit is similar to those described in conjunction with FIG. 18 and detailed description thereof is thus omitted.

(Embodiment 10)

Figure 23:
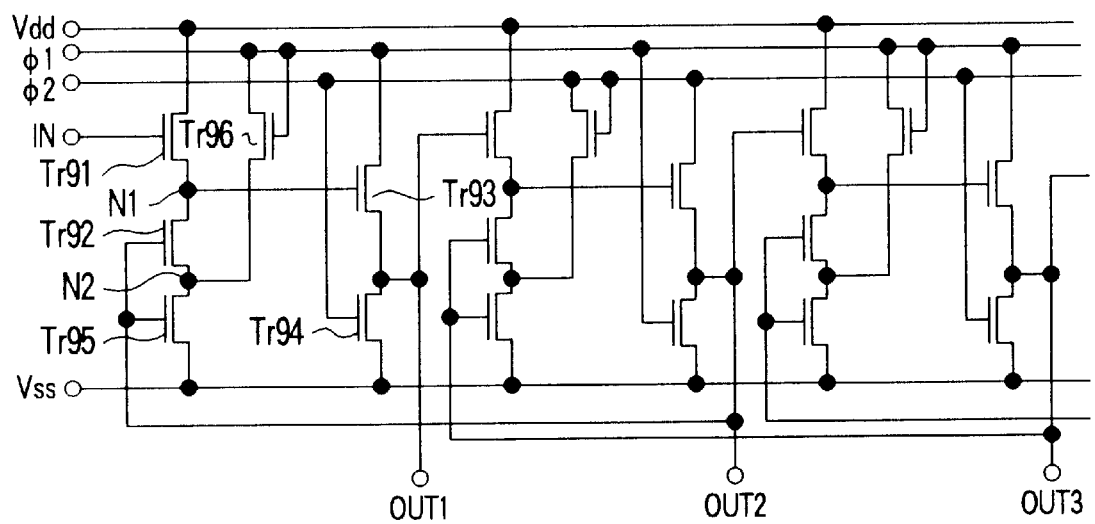
FIG. 23 is a circuit diagram showing a seventh embodiment of a shift register circuit using a bootstrap circuit according to the present invention.

The seventh embodiment of a shift register circuit having a bootstrap circuit according to the present invention is described with reference to FIG. 23. The differences between this shift register circuit and the shift register shown in FIG. 18 are that the gate electrode of the transistor Tr96 is connected alternatively stage by stage to a terminal for the clock pulse Φ1 or a terminal for the clock pulse Φ2 and that the source and the drain electrodes of the transistor Tr96 are connected alternatively stage by stage between a terminal for the clock pulse Φ1 and the node N2 or between a terminal for the clock pulse Φ2 and the node N2. Operation of the circuit is similar to those described in conjunction with FIG. 18 and detailed description thereof is thus omitted.

(Embodiment 11)

Figure 24:
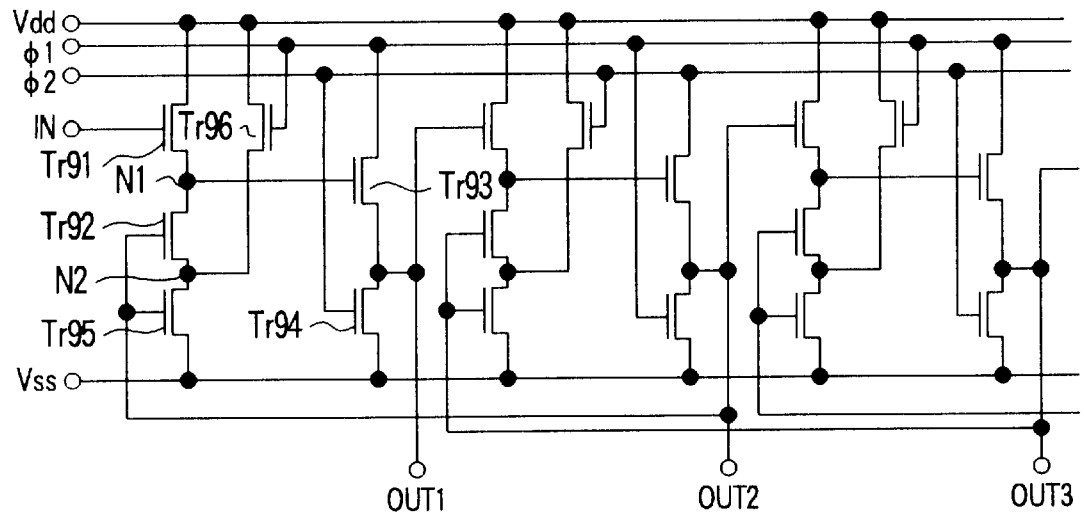
FIG. 24 is a circuit diagram showing an eighth embodiment of a shift register circuit using a bootstrap circuit according to the present invention.

The eighth embodiment of a shift register circuit having a bootstrap circuit according to the present invention is described with reference to FIG. 24. The differences between this shift register circuit and the shift register shown in FIG. 18 are that the gate electrode of the transistor Tr96 is connected alternatively stage by stage to a terminal for the clock pulse Φ1 or a terminal for the clock pulse Φ2 and that the drain and the source electrodes of the transistor Tr96 are connected between the power source voltage Vdd on the higher potential side and the node N2. Operation of the circuit is similar to those described in conjunction with FIG. 18 and detailed description thereof is thus omitted.

(Embodiment 12)

Figure 25:
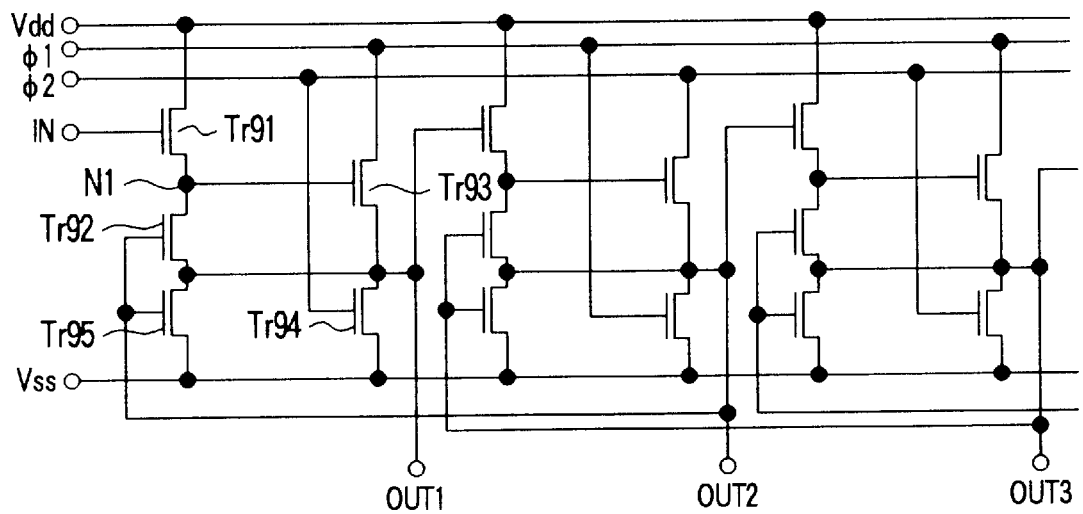
FIG. 25 is a circuit diagram showing a ninth embodiment of a shift register circuit using a bootstrap circuit according to the present invention.

The ninth embodiment of a shift register circuit having a bootstrap circuit according to the present invention is described with reference to FIG. 25. The differences between this shift register circuit and the shift register shown in FIG. 18 are that the transistor Tr96 is omitted and the output terminal OUT1 is directly connected to the junction or the node between the transistors Tr92 and Tr95. According to this embodiment, the number of the transistors per one stage can be reduced by one. Operation of the circuit is similar to those described in conjunction with FIG. 18 and detailed description thereof is thus omitted.

(Embodiment 13)

Figure 26:
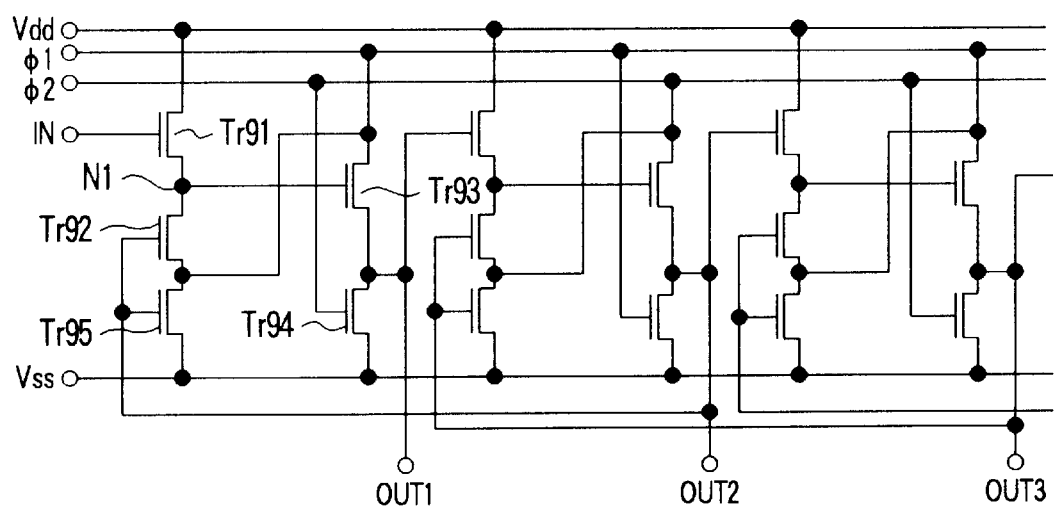
FIG. 26 is a circuit diagram showing a tenth embodiment of a shift register circuit using a bootstrap circuit according to the present invention.

The tenth embodiment of a shift register circuit having a bootstrap circuit according to the present invention is described with reference to FIG. 26. The differences between this shift register circuit and the shift register shown in FIG. 18 are that the transistor Tr96 is omitted and that the junction or the node between the transistors Tr92 and Tr95 is alternatively connected stage by stage to a terminal for the clock pulse Φ1 or a terminal for the clock pulse Φ2. Operation of the circuit is similar to those described in conjunction with FIG. 18 and detailed description thereof is thus omitted.

The above-mentioned embodiments are for the case where the transistors forming the bootstrap circuit, in which a voltage higher than the power source voltage for the circuit is applied between the source and the drain electrodes, are divided into two transistors connected in series. However, the transistors may be divided into three or more transistors connected in series to apply a voltage equal to or lower than the power source voltage to the junctions or nodes between them.

As described above, the bootstrap circuit according to the present invention can provide a buffer circuit or a shift register circuit capable of operating at a high speed, without any circuit design to restrict the bootstrap effect nor reduction of the power source voltage for the circuit. This is because a voltage not higher than the power source voltage for the circuit is applied between the drain and the source electrodes of all transistors forming the circuit.

What is claimed is:

1. A bootstrap circuit comprising:

first through third MOS transistors and reset circuit;

a first main electrode of said first MOS transistor and a first main electrode of said second MOS transistor connected to an output terminal;

a second main electrode of said first MOS transistor connected to a power source voltage Vdd on a high potential side;

a gate electrode of said first MOS transistor connected to a first node;

a second main electrode of said second MOS transistor connected to a power source voltage Vss on a low potential side;

a first main electrode of said third MOS transistor connected to said power source voltage Vdd;

a second main electrode of said third MOS transistor connected to said first node;

a gate electrode of said third MOS transistor connected to a signal input terminal;

said third MOS transistor adapted to apply an input signal to and conduct said signal input terminal thereby to charge said first node; and said reset circuit connected between said first node and said power source voltage Vss and having a reset input terminal, said reset circuit adapted to apply a reset signal to said reset input terminal thereby to discharge said first node, wherein said reset circuit includes fourth through sixth MOS transistors, a first main electrode of said fourth MOS transistor, a first main electrode of said fifth MOS transistor, and a first main electrode of said sixth MOS transistor connected to a second node, a second main electrode of said sixth MOS transistor connected to said output terminal, a gate electrode of said sixth MOS transistor connected to said first node, and said reset signal applied to a gate electrode of said fourth MOS transistor and a gate electrode of said fifth MOS transistor.

2. A bootstrap circuit as claimed in claim 1, wherein said MOS transistor is a thin film transistor.

3. A bootstrap circuit as claimed in claim 1, wherein a bootstrap capacitance is connected between said first node and said output terminal.

4. A bootstrap circuit comprising:

first through third MOS transistors and reset circuit;

a first main electrode of said first MOS transistor and a first main electrode of said second MOS transistor connected to an output terminal;

a second main electrode of said first MOS transistor connected to a power source voltage Vdd on a high potential side;

a gate electrode of said first MOS transistor connected to a first node;

a second main electrode of said second MOS transistor connected to a power source voltage Vss on a low potential side;

a first main electrode of said third MOS transistor connected to said power source voltage Vdd;

a second main electrode of said third MOS transistor connected to said first node;

a gate electrode of said third MOS transistor connected to a signal input terminal;

said third MOS transistor adapted to apply an input signal to and conduct said signal input terminal thereby to charge said first node;

said reset circuit connected between said first node and said power source voltage Vss and having a reset input terminal, said reset circuit adapted to apply a reset signal to said reset input terminal thereby to discharge said first node, wherein said reset circuit is formed of a fourth MOS transistor and a fifth MOS transistor, a first main electrode of said fourth MOS transistor and a first main electrode of said fifth MOS transistor connected to said output terminal, and said reset signal applied to a gate electrode of said fourth MOS transistor and a gate electrode of said fifth MOS transistor.

5. A bootstrap circuit as claimed in claim 4, wherein said MOS transistor is a thin film transistor.

6. A bootstrap circuit as claimed in claim 4, wherein a bootstrap capacitance is connected between said first node and said output terminal.

7. A bootstrap circuit comprising:

a first MOS transistor;

a second MOS transistor;

a charge circuit;

a discharge circuit;

a first main electrode of said first MOS transistor and a first main electrode of said second MOS transistor connected to an output terminal;

a second main electrode of said first MOS transistor connected to a first clock terminal for use in receiving first clock pulses;

a gate electrode of said first MOS transistor connected to a first node;

a second main electrode of said second MOS transistor connected to a power source voltage Vss on a low potential side;

said charge and discharge circuits connected between said first node and a signal input terminal and having a control input terminal, said charge and discharge circuit adapted to apply second clock pulses to said control input terminal and apply an input signal to said signal input terminal, and to charge and discharge said first node with electric charges on said input signal, wherein said charge and discharge circuits are formed of third through fifth MOS transistors, a first main electrode of said third MOS transistor, a first main electrode of said fourth MOS transistor, and a first main electrode of said fifth MOS transistor connected to a second node, a second main electrode of said third MOS transistor connected to said first node, a second main electrode of said fourth MOS transistor connected to said signal input terminal, a second main electrode of said fifth MOS transistor connected to said output terminal, a gate electrode of said fifth MOS transistors connected to said first clock terminal, and gate electrodes of said third and said fourth MOS transistors connected to a second clock terminal for use in receiving second clock pulses.

8. A shift register circuit comprising:

a plurality of bootstrap circuits, said boot strap circuits comprising a first MOS transistor;

a second MOS transistor;

a charge circuit;

a discharge circuit;

a first main electrode of said first MOS transistor and a first main electrode of said second MOS transistor connected to an output terminal;

a second main electrode of said first MOS transistor connected to a first clock terminal for use in receiving first clock pulses;

a gate electrode of said first MOS transistor connected to a first node;

a second main electrode of said second MOS transistor connected to a power source voltage Vss on a low potential side;

said charge and discharge circuits connected between said first node and a signal input terminal and having a control input terminal, said charge and discharge circuit adapted to apply second clock pulses to said control input terminal and apply an input signal to said signal input terminal, and to charge and discharge said first node with electric charges on said input signal, wherein said charge and discharge circuits are formed of third through fifth MOS transistors, a first main electrode of said third MOS transistor, a first main electrode of said fourth MOS transistor, and a first main electrode of said fifth MOS transistor connected to a second node, a second main electrode of said third MOS transistor connected to said first node, a second main electrode of said fourth MOS transistor connected to said signal input terminal, a second main electrode of said fifth MOS transistor connected to said output terminal, a gate electrode of said fifth MOS transistors connected to said first clock terminal, and gate electrodes of said third and said fourth MOS transistors connected to a second clock terminal for use in receiving second clock pulses; and, wherein said plurality of boot strap circuits are cascade connected to each other with said output terminal of said bootstrap circuit in an $N^{th}$ stage connected to said signal input terminal of said bootstrap circuit in an $(N+1)^{th}$ stage, said first clock pulses and said second clock pulses are alternatively applied to said bootstrap circuits in an odd stage and said bootstrap circuits in an even stage, respectively.

9. A bootstrap circuit comprising:

a first MOS transistor and a second MOS transistor that are connected in series between a power source voltage Vdd on a high potential side and a power source voltage Vss on a low potential side to form an inverter circuit;

a gate electrode of said first MOS transistor connected to a first node;

said bootstrap circuit further comprising a charge circuit and a reset circuit;

said charge circuit charging said first node with electric charges having a voltage value of between those of said power source voltage Vdd and the power source voltage Vss;

said reset circuit connected between said first node and said power source voltage Vss for discharging said first node in response to a reset signal;

said first node having a voltage that is higher than the voltage of said power source voltage Vdd due to a bootstrap effect when said first MOS transistor has a conductive stage, wherein said reset circuit is formed of a third MOS transistor and a fourth MOS transistor that are connected in series between said first node and said power source voltage Vss, said reset signal applied to gate electrodes of said third MOS transistor and said fourth MOS transistor, said bootstrap circuit further comprising a junction voltage apply circuit, and said junction voltage apply circuit adapted to apply a junction voltage to ajunction of connection in series between said third MOS transistor and said fourth MOS transistor, the junction voltage having an amplitude of between those of said power source voltage Vdd and the power source voltage Vss and the junction voltage applied at a timing controlled by the voltage across said first node.

10. A bootstrap circuit comprising:
a first MOS transistor and a second MOS transistor that are connected in series between a power source voltage Vdd on a high potential side and a power source voltage Vss on a low potential side to form an inverter circuit;
a gate electrode of said first MOS transistor connected to a first node;
said bootstrap circuit further comprising a charge circuit and a reset circuit;
said charge circuit charging said first node with electric charges having a voltage value of between those of said power source voltage Vdd and said power source voltage Vss;
said reset circuit connected between said first node and said power source voltage Vss for discharging said first node in response to a reset signal;
said first node having a voltage that is higher than the voltage of said power source voltage Vdd due to a bootstrap effect when said first MOS transistor has a conductive stage, wherein
said reset circuit is formed of a third MOS transistor and a fourth MOS transistor that are connected in series between said first node and said power source voltage Vss,
said reset signal applied to gate electrodes of said third MOS transistor and said fourth MOS transistor, and
an output voltage of said inverter circuit applied to a junction of connection in series between said third MOS transistor and said fourth MOS transistor.

11. A bootstrap circuit comprising:
a first MOS transistor and a second MOS transistor that are connected in series between a clock terminal for receiving clock pulses and a power source voltage Vss on a low potential side to form an inverter circuit;
a gate electrode of said first MOS transistor connected to a first node;
said clock pulses having an amplitude of between those of the power source voltage Vss and the power source voltage Vdd;
said bootstrap circuit further comprising a charge circuit and a reset circuit;
said charge circuit charging said first node with electric charges having a voltage value of between those of said power source voltage Vdd and the power source voltage Vss;
said reset circuit connected between said first node and said power source voltage Vss for discharging said first node in response to a reset signal; and
said first node having a voltage that is higher than the voltage of said power source voltage Vdd due to a bootstrap effect when said first MOS transistor has a conductive state, wherein p1 said reset circuit is formed of a third MOS transistor and a fourth MOS transistor that are connected in series between said first node and said power source voltage Vss,
said reset signal applied to gate electrodes of said third MOS transistor and said fourth MOS transistor, and
said bootstrap circuit further comprising a junction voltage apply circuit, said junction voltage apply circuit adapted to apply a junction voltage to a function of connection in series between said third MOS transistor and said fourth MOS transistor, the junction voltage having an amplitude of between those of said power source voltage Vdd and the power source voltage Vss and the junction voltage applied at a timing controlled by the voltage across said first node.

12. A bootstrap circuit comprising:
a first MOS transistor and a second MOS transistor that are connected in series between a clock terminal for supplying clock pulses and a power source voltage Vss on a low potential side to form an inverter circuit;
a gate electrode of said first MOS transistor connected to a first node;
said clock pulses having an amplitude of between those of said power source voltage Vss and said power source voltage Vdd,
said bootstrap circuit further comprising a charge circuit and a reset circuit;
said charge circuit charging said first node with electric charges having a voltage value of between those of said power source voltage Vdd and the power source voltage Vss;
said reset circuit connected between said first node and said power source voltage Vss for discharging said first node in response to a reset signal; and
said first node having a voltage that is higher than the voltage of said power source voltage Vdd due to a bootstrap effect when said first MOS transistor has a conductive state, wherein
said reset circuit is formed of a third MOS transistor and a fourth MOS transistor that are connected in series between said first node and said power source voltage Vss,
said reset signal applied to gate electrodes of said third MOS transistor and said fourth MOS transistor,
said bootstrap circuit further comprising a junction voltage apply circuit,
said junction voltage apply circuit adapted to apply a junction voltage to a function of connection in series between said third MOS transistor and said fourth MOS transistor, the junction voltage having an amplitude of between those of said power source voltage Vdd and the power source voltage Vss and the junction voltage applied at a timing controlled by the voltage of said clock pulses.

13. A bootstrap circuit comprising:
a first MOS transistor and a second MOS transistor that are connected in series between a clock terminal for receiving clock pulses and a power source voltage Vss on a low potential side to form an inverter circuit;
a gate electrode of said first MOS transistor connected to a first node;
said clock pulses having an amplitude of between those of said power source voltage Vss and said power source voltage Vdd;
said bootstrap circuit further comprising a charge circuit and a reset circuit,
said charge circuit charging said first node with electric charges having a voltage value of between those of said power source voltage Vdd and said power source voltage Vss,
said reset circuit connected between said first node and said power source voltage Vss for discharging said first node in response to a reset signal; and
said first node having a voltage that is higher than the voltage of said power source voltage Vdd due to a bootstrap effect when said first MOS transistor has a conductive state, wherein said reset circuit is formed of a third MOS transistor and a fourth MOS transistor that are connected in series between said first node and said power source voltage Vss, said reset signal applied to gate electrodes of said third MOS transistor and said fourth MOS transistor, and an output voltage of said inverter circuit applied to a junction of connection in series between said third MOS transistor and said fourth MOS transistor.

14. A bootstrap circuit comprising:

a first MOS transistor and a second MOS transistor that are connected in series between a clock terminal for receiving clock pulses and a power source voltage Vss on a low potential side to form an inverter circuit;

a gate electrode of said first MOS transistor connected to a first node;

said clock signal having an amplitude of between those of said power source voltage Vss and said power source voltage Vdd;

said bootstrap circuit further comprising a charge circuit and a reset circuit;

said charge circuit charging said first node with electric charges having a voltage value of between those of said power source voltage Vdd and said power source voltage Vss;

said reset circuit connected between said first node and said power source voltage Vss for discharging said first node in response to a reset signal; and said first node having a voltage that is higher than the voltage of said power source voltage Vdd due to a bootstrap effect when said first MOS transistor has a conductive state, wherein said reset circuit is formed of a third MOS transistor and a fourth MOS transistor that are connected in series between said first node and said power source voltage Vss, said reset signal applied to gate electrodes of said third MOS transistor and said fourth MOS transistor, and said clock pulses applied to a junction of connection in series between said third MOS transistor and said fourth MOS transistor.

* * * * *